United States Patent [19]

Botez et al.

[11] Patent Number: 4,722,089
[45] Date of Patent: Jan. 26, 1988

[54] PHASE LOCKED DIODE LASER ARRAY

[75] Inventors: Dan Botez, Randolph; Eugene I. Gordon, Convent Station, both of N.J.

[73] Assignee: Lytel, Incorporated, Somerville, N.J.

[21] Appl. No.: 809,580

[22] Filed: Dec. 16, 1985

[51] Int. Cl.[4] .......................... H01S 3/19; H01S 3/082; H01L 33/00
[52] U.S. Cl. ........................................ 372/50; 357/16; 357/17; 372/18; 372/45; 372/46; 372/97
[58] Field of Search ........................ 372/50, 45, 46, 44, 372/49, 18, 97; 357/16, 17; 356/96.12

[56] References Cited

U.S. PATENT DOCUMENTS 4,255,717  3/1981  Seifres et al. ........................ 372/50
4,369,513  1/1983  Umeda et al. ........................ 372/50

OTHER PUBLICATIONS

D. Botez, "Laser Diodes Are Powered-Packed," IEEE Spectrum, Jun. 1985, pp. 43–53.

Primary Examiner—James W. Davie
Assistant Examiner—Georgia Y. Epps
Attorney, Agent, or Firm—Marmorek, Guttman & Rubenstein

[57] ABSTRACT

The present invention is a semiconductor diode laser array which favors oscillation in the zero degree phase shift mode. The array comprises first and second sets of waveguides which are interdigitated in a coupling region. Energy transfer between the first and second sets of waveguides by way of evanescent coupling is needed to define the feedback paths for sustaining laser oscillations in the waveguides. Such coupling is optimum and the threshold current for lasing lowest when all of the waveguides in both sets oscillate in phase.

15 Claims, 15 Drawing Figures

FIG. 2
FIG. 2A
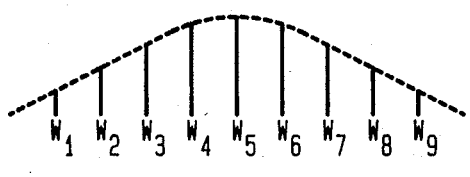
FIG. 2B
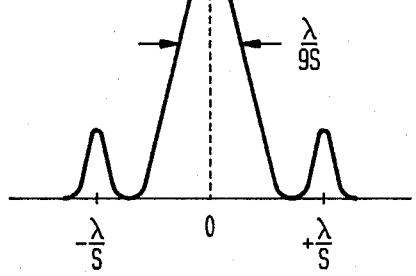
FIG. 2C
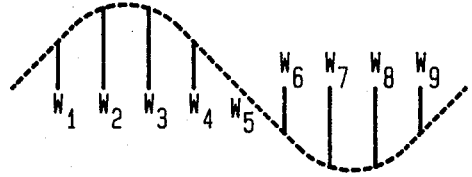
FIG. 2D
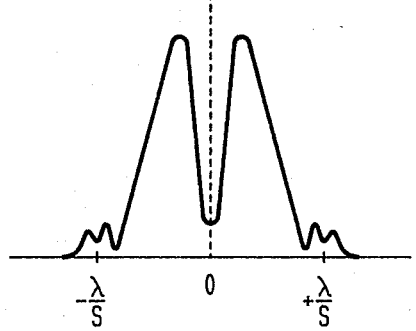
FIG. 2E
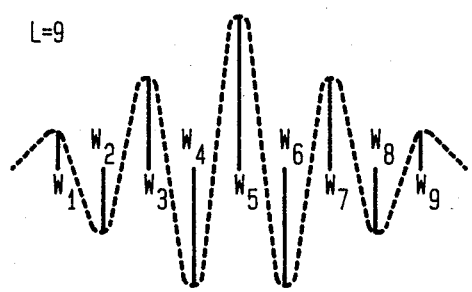
FIG. 2F
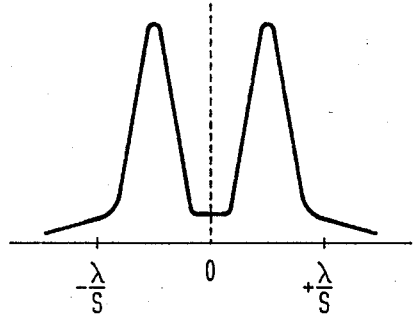

PHASE LOCKED DIODE LASER ARRAY

FIELD OF THE INVENTION

This invention relates to a linear array of semiconductor diode lasers and, more particularly, to a linear array of phase-locked semiconductor diode lasers which operates stably and reliably in the zero degree phase shift mode to produce a single lobe diffraction limited beam in the far field.

BACKGROUND OF THE INVENTION

One of the shortcomings of semiconductor diode lasers is that there are inherent limits on the power output obtainable from a single element diode laser. Above a certain power, the single element diode laser, no matter what its construction, will be destroyed by facet-mirror damage or by heating from the electric power dissipated within it.

One approach to circumventing these inherent limitations, to achieve output powers of 100 to 500 mW, involves coupling a line of index guided laser devices to form a phase-locked laser array. In a linear phase-locked array, 8 to 10 index-guided lasers are fabricated on the same substrate so that each has a structure identical to that of its neighbors. Illustratively, the 8 to 10 index guided laser elements extend between a pair of parallel, spaced apart, partially reflecting crystal end facets which form a Fabry-Perot Resonator for the individual laser elements in the array. A pumping current may be applied to the individual laser elements comprising the array by a common electric contact as wide as the entire array.

The evanescent optical field of each laser element in the array overlaps the neighboring laser elements. Thus, each device couples with its nearest neighbors and all the lasers in the array act together as one powerful source.

When individual index-guided lasers are coupled in a phase-locked array, they can operate in many array modes. If they couple together in phase—the so-called 0° phase shift mode—the far field patterns from the individual elements interfere with each other constructively on axis and can provide a well-defined beam comprising a single lobe. If they couple so that each laser element is out of phase with its neighbors—the 180° phase shift mode—the far field patterns from the individual laser elements interfere destructively on axis, generally producing a two-lobe beam. There are also complex intermediate cases, but none produces a well collimated single lobe beam except the zero degree phase shift mode.

In theory, the narrowest possible angular width of an array's beam is about equal to the wavelength emitted by the array divided by the product of the number of elements and the spacing between them. This is the beam width of a single source as wide as the whole array, limited only by the diffraction of light. For example, a 10-element array in which each element is separated 5 microns from its neighbors and which emits at a wavelength of 0.85 microns should be able to deliver up to 500 mW of power into a beam as narrow as 1 degree.

In practice, operation of a laser array in the zero degree phase shift mode to produce a single-lobe, diffraction-limited beam in the far field has been more the exception than the rule. Presently available laser arrays are more likely to oscillate in the 180° phase shift mode, as this mode is less lossy than the zero degree phase shift mode and thus has a lower threshold current. In addition, the most common experimental result in phase locked arrays has been a two-lobed far field pattern similar to that obtained in the 180° phase shift mode, but wherein the width of each lobe is two to three times the diffraction limited width as a result of several array modes oscillating simultaneously. Thus, presently available laser arrays are unsuitable for many applications such as optical recording and high bit rate optical communications which require single-lobe, diffraction-limited beams in the far field.

Accordingly, it is the object of the present invention to provide an array of index-guided laser elements formed on a single substrate, which array oscillates stably and reliably in the zero degree phase shift mode so as to produce a single lobe diffraction limited beam in the far field.

SUMMARY OF THE INVENTION

The present invention is a semiconductor diode laser array which operates in tne zero degree phase shift mode.

In an illustrative embodiment, the laser array of the present invention comprises a semiconductor body having first and second parallel spaced apart cleaved end facets. Extending inward from the first facet is a first set of parallel spaced apart fundamental mode active waveguides, which waveguides terminate before the second facet. Extending inward from the second facet is a second set of parallel spaced apart fundamental mode active waveguides, which waveguides terminate before the first facet. The waveguides of the first set are interdigitated with the waveguides of the second set in a coupling region. Both sets of laser waveguides may be pumped from a common electrical contact.

Because no waveguide in either set extends between both facets, the feedback paths necessary to sustain laser oscillations depend on the transfer of energy via evanescent optical coupling between the waveguides in the first set and the waveguides in the second set. As is explained below, such energy transfer via optical coupling is optimum for the zero degree phase shift mode. Thus, the zero degree phase shift mode is the least lossy and has the lowest threshold current.

More particularly, consider two adjacent fundamental mode waveguides in the first set and one fundamental mode waveguide from the second set located between the two waveguides of the first set. By themselves, the two adjacent fundamental-mode, evanescently coupled waveguides of the first set may oscillate in phase (i.e. the zero-degree phase shift mode) or out of phase (i.e. the 180 degree phase shift mode). However, in the present case, feedback for sustaining laser oscillations in the two waveguides of the first set depends on optical coupling and energy transfer into the fundamental-mode waveguide of the second set located therebetween. If the two waveguides in the first set oscillated out of phase, the evanescent fields which couple into the laser waveguide of the second set would cancel each other out and there would be no feedback. Thus, the two waveguides in the first set can only oscillate in phase, in which case there is feedback, as the evanescent fields from the two waveguides in the first set interfere constructively to excite an in-phase mode in the waveguide of the second set to define a feedback path. Because of this mechanism, the threshold current for lasing is lowest when all of the lasers in both sets of interdigitated waveguides oscillate in phase to produce a laser array which operates in the zero degree phase shift mode.

A mechanism for suppressing higher order array modes may be provided so that a diffraction limited, single lobe beam is produced in the far field. Such higher order array modes may be suppressed by introducing losses in the array where the higher order array modes have their maxima. The resulting high power laser array is thus useful in such fields as high bit rate optical communications and optical recording.

BRIEF DESCRIPTION OF THE DRAWINGS

FIG. 2A–2F shows the modes and associated far field patterns for the laser array of FIG. 1.

For purposes of clarity, the drawings have not been drawn to scale. In the drawings, like elements are identified by like characters.

DETAILED DESCRIPTION OF THE INVENTION

Figure 1:
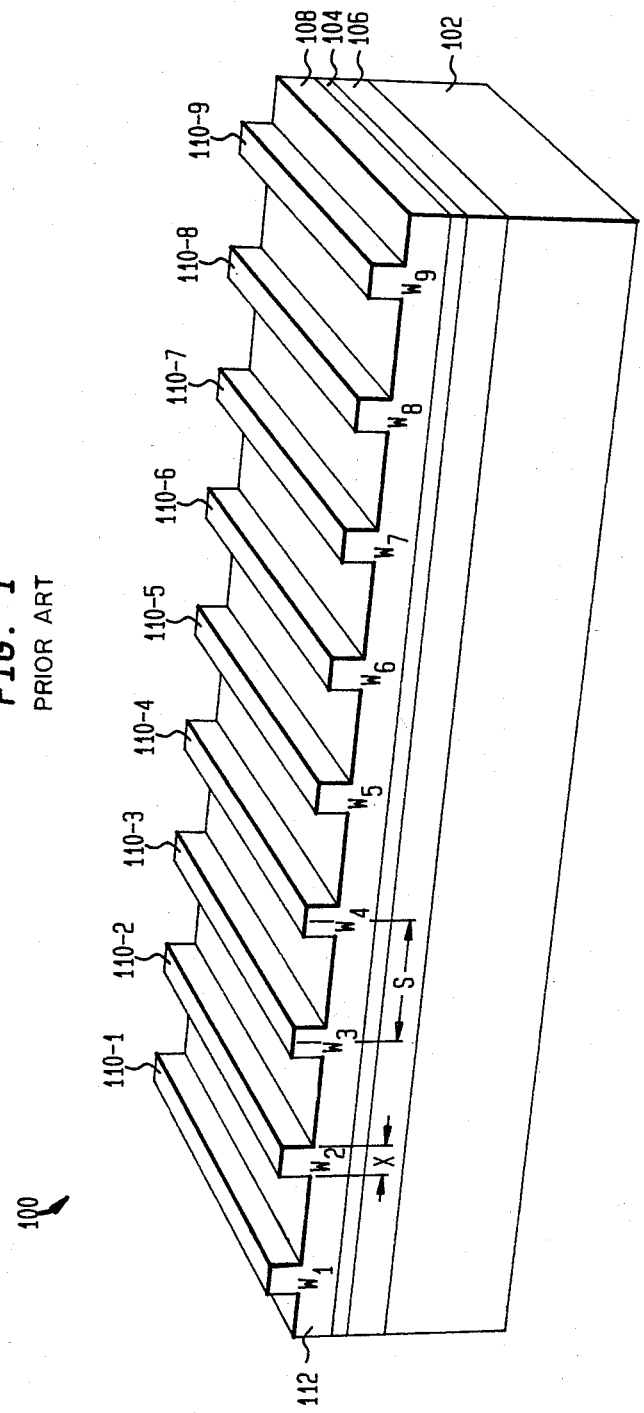
FIG. 1 shows a prior art laser array comprising 9 adjacent index-guided lasers formed on a single substrate.

Before describing the present invention in detail, it may be helpful to briefly review the operation of prior art semiconductor diode laser arrays. Turning to FIG. 1, a typical prior art diode laser array 100 implemented in the AlGaAs materials system is illustrated.

The laser array 100 of FIG. 1 comprises an n-type GaAs substrate 102. The substrate 102 has a thickness of about 100 microns and a dopant concentration of about $3 \times 10^{18}$ cm$^{-3}$. An undoped GaAs active layer 104 having a thickness of about 0.05–0.15 microns is sandwiched between and contiguous with cladding layers 106 and 108 which are formed from Al$_x$Ga$_{1-x}$As, where x is between 0.25 and 0.45. The layer 106 is an n-type layer having a thickness of about 1 micron and a dopant concentration of about $3 \times 10^{18}$ cm$^{-3}$. The layer 108 is a p-type layer also having a dopant concentration of about $3 \times 10^{18}$ cm$^{-3}$.

Nine ridges 110-1, 110-2 . . . 110-9 are formed in the cladding layer 108. Illustratively, the portions of layer 108 not contributing to the ridges have a thickness of about 0.3–0.5 microns, while the ridges add an additional thickness ranging from 0.7–1.5 microns. Each ridge has a width x of about 2–3 microns and the spacing s between ridge centers is about 4–6 microns. Thus, the ridges 110-1 . . . 110-9 serve to define adjacent index-guided fundamental lateral mode active waveguides, designated $W_1$, $W_2$ . . . $W_9$ in FIG. 1. A heavily doped p-type GaAs capping layer (not shown) is left atop each of the ridges 110-1 . . . 110-9 after the ridge formation.

A forward bias may be applied to the laser array 100 by means of a contact (not shown) as wide as the array. In the case of an array of ridge-guide lasers (FIG. 1) ohmic (electrical) contct is made only atop the ridges, where heavily doped p-type GaAs capping layers (not shown in FIG. 1) are present. When a forward bias is applied to the array, electrons and holes are injected from the cladding layers 106 and 108, respectively, into the active layer 104. Radiative recombination takes place in the active layers. The emitted radiation travels longitudinally, between the partially reflecting crystal end facet 112 and a parallel oppositely disposed crystal end facet not shown in FIG. 1. When the round trip optical gain exceeds losses due to such mechanisms as scattering, absorption, and facet transmission, laser oscillations are sustained.

Radiation propagating in or near the active layer 104 tends to be laterally confined to the regions underneath the ridges 110-1 . . . 110-9 because of changes in effective index of refraction from the ridge to the non-ridge areas. Thus, when the ridge width (x) and spacing (s) are chosen roughly as indicated above, the nine fundamental mode coupled laser waveguides $W_1$ . . . $W_9$ result. The waveguides $W_1$ . . . $W_9$ are coupled because they are spaced closely enough so that the evanescent optical field of each waveguide spreads out and overlaps the adjacent waveguides. For a discussion of the geometry of phase-locked laser arrays, see Streifer et al, "Criteria for Design of Single-Lobe Phased Array Diode Lasers", *Electronic Letters* 23rd May 1985, Vol. 21, No. 11, pp. 505–506.

The array 100 of fundamental mode laser waveguides $W_1$ . . . $W_9$ can oscillate in 9 array modes. These modes and the far field patterns produced by these modes are shown in FIG. 2. In the L = 1 mode, shown in FIG. 2(A), all the waveguides $W_1$ . . . $W_9$ oscillate in phase. This is the zero degree phase shift mode. The far field pattern for this mode, shown in FIG. 2(B), is characterized by a single central lobe whose diffraction limited angular width is about $\lambda/9s$ where $\lambda$ is the wavelength emitted by the laser array.

In the L = 9 mode, shown in FIG. 2(E), adjacent waveguides oscillate out of phase. This is the 180° phase shift mode. The far field pattern for the 180° phase shift mode is shown in FIG. 2(F) and comprises two spaced apart lobes.

In between the L = 1 and L = 9 modes are modes L = 2, L = 3, . . ., L = 8. The L = 2 mode is shown in FIG. 2(C) and the corresponding far field pattern is shown in FIG. 2(D). In the L=2 mode, waveguides $W_1$ . . . $W_4$ are in phase with each other and the waveguides $W_6$ . . . $W_9$ are in phase with each other while being out of phase with waveguides $W_1$ . . . $W_4$. The L=2 mode far field pattern comprises two closely spaced central lobes.

For the laser array 100 of FIG. 1, the L = 9, 180° phase shift mode, is less lossy and has a lower threshold current than the L=1, zero degree phase shift mode. Accordingly, the laser array 100 of FIG. 1 is more likely to oscillate in the L=9 mode than in the L=1 mode. For this reason, the laser array 100 is unsatisfactory for applications such as optical disk recording and high bit rate optical communications where a single lobe diffraction limited far field pattern is required. The L = 9 zero degree phase shift mode has the lowest threshold current because the overlap of the optical field and gain distribution is maximized for that mode. The L = 9 mode has nodes between adjacent ridges, where absorption is maximized because the interridge regions are poorly pumped and/or optically absorptive. Thus, the L =9 mode "sees" a minimum of optical absorption between ridges.

Figure 3:
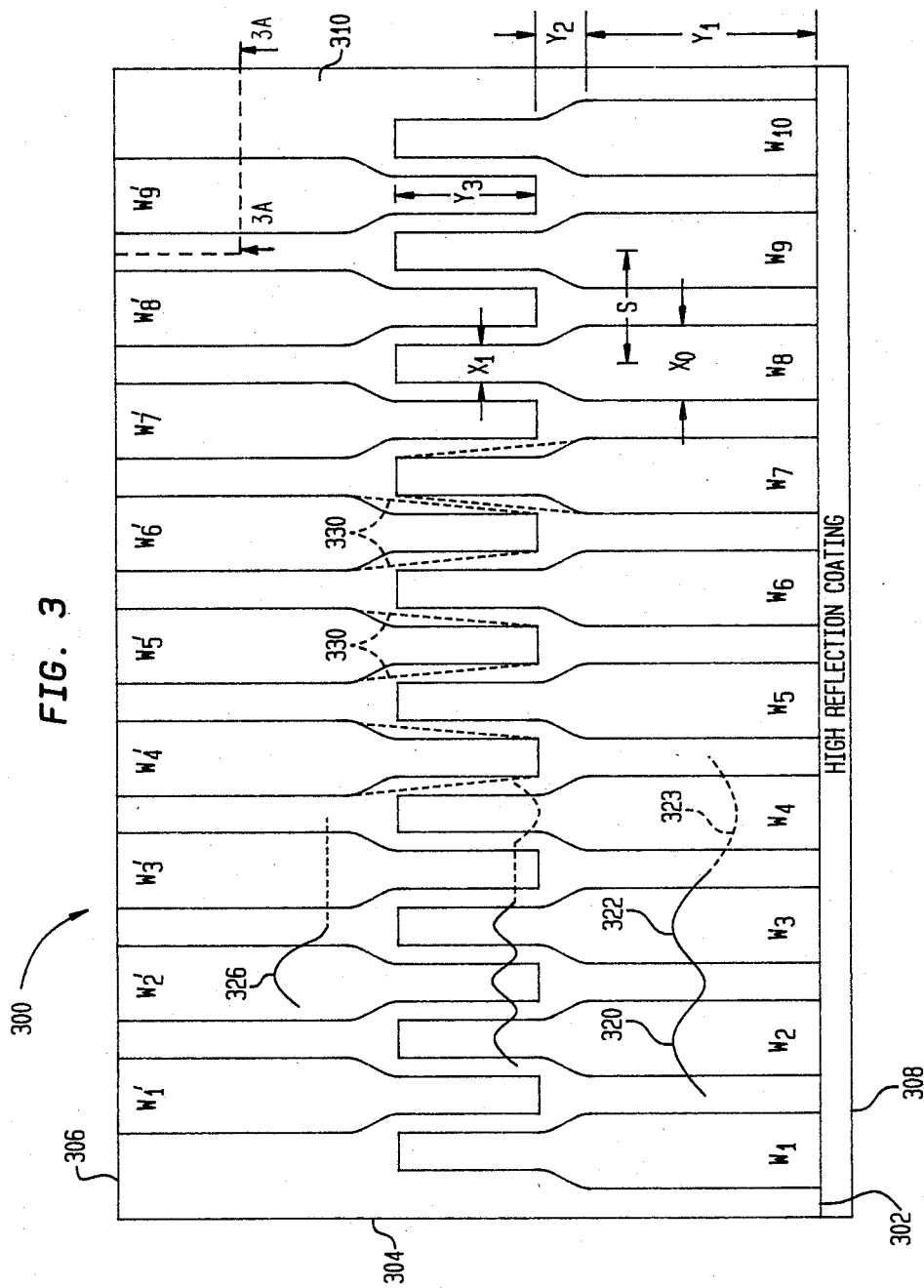
FIG. 3 shows a laser array comprising two interdigitated sets of single mode waveguides.

Turning to FIG. 3, a laser array 300 which favors oscillation in the L = 1, zero degree phase shift mode is schematically illustrated. Like the laser array 100 of FIG. 1, the laser array 300 may be a double heterostructure comprising a semiconductor body 304 having two relatively wide bandgap cladding layers (not shown) of opposite conductivity type, which cladding layers are separated by a narrow bandgap active layer (not shown). The cladding layers and the active layer are formed on a suitable substrate. Instead of being formed as a double heterostructure (DH), the laser array 300 may be a large optical cavity (LOC) structure. In this case, a relatively thick cavity-defining layer having an index of refraction intermediate between that of the active layer and the cladding layers is formed between the active layer and the lower and/or upper cladding layer. Most of the light propagates in the thick cavity layer while obtaining gain from the active layer.

The active waveguides comprising the laser array 300 of FIG. 3 may be defined by ridges formed in the upper cladding layer as was the case in FIG. 1. Alternatively, other structures may be used to define the waveguides such as, for example, inverted rib structures and V-groove structures. Structures for defining lateral waveguides in a double heterostructure or large-optical-cavity structure are disclosed in Botez, "Laser Diodes Are Power Packed", *IEEE Spectrum*, June 1985, pp. 43-54.

The laser array 300 comprises two sets of interdigitated fundamental mode waveguides. A first set of fundamental mode waveguides $W_1, W_2 \ldots W_{10}$ extends inward from the crystal end facet 302 of the semiconductor body 304 comprising the laser array 300. The waveguides $W_1, W_2 \ldots W_{10}$ do not reach the oppositely disposed parallel end facet 306. A second set of fundamental mode waveguides $W_1', W_2' \ldots W_9'$ extends inward from the facet 306. The waveguides $W_1' \ldots W_9'$ terminate before the facet 302. The end facet 302 has a high reflectivity coating 308 thereon so that the end facet 306 is the exit facet for the laser array 300.

As is discussed below, the waveguides $W_1 \ldots W_{10}$ and $W_1' \ldots W_9'$ are arranged so that the waveguides $W_1' \ldots W_9'$ favor oscillation in the zero degree phase shift mode so as to produce a single lobe beam in the far field. To this end, the two sets of waveguides $W_1 \ldots W_{10}$ and $W_1' \ldots W_9'$ are interdigitated in a coupling region 310. In the coupling region, each waveguide is close enough to neighboring waveguides from the other set so that the evanescent optical field from each waveguide spreads out and overlaps the neighboring waveguides from the other set. For example, the evanescent optical field from the fundamental mode waveguide $W_2$ spreads out and overlaps the fundamental mode waveguides $W_1'$ and $W_2'$ so that waveguide $W_2$ is optically coupled to the waveguides $W_1'$ and $W_2'$. Similarly, the evanescent optical field from the fundamental mode waveguide $W_1'$ overlaps the fundamental mode waveguides $W_1$ and $W_2$, thus providing coupling between the waveguide $W_1'$ and the waveguides $W_1$ and $W_2$.

Because no waveguide in either set extends between both end facets 302 and 306, the transfer of energy via optical coupling between the waveguides $W_1 \ldots W_{10}$ and the waveguides $W_1' \ldots W_9'$ is necessary to define feedback paths for sustaining laser oscillations in the waveguides $W_1 \ldots W_{10}$ and $W_1' \ldots W_9'$. If there is no such coupling, feedback is minimal and none of the waveguides in either set can support laser oscillations at practical drive-current levels.

Coupling between the waveguides $W_1 \ldots W_{10}$ and the waveguides $W_1' \ldots W_9'$ is maximum when all of the waveguides $W_1 \ldots W_{10}, W_1' \ldots W_9'$ oscillate in phase. Thus, the threshold current is lowest when all of the waveguides $W_1 \ldots W_{10}, W_1' \ldots W_9'$ oscillate in phase. Accordingly, if one views the exit facet 306, one sees nine fundamental mode waveguides $W_1' \ldots W_9'$ which favor oscillation in phase corresponding to the L=1 zero degree phase shift mode. Thus, the laser array 300 produces a single lobe beam in the far field suitable for applications such as high bit rate optical communications and optical recording. In contrast, if one views the exit facet of the array 100 of FIG. 1, one sees nine fundamental mode waveguides which favor oscillation in the 180° phase shift mode.

The reason that the threshold current is lowest when the waveguides $W_1 \ldots W_{10}, W_1' \ldots W_9'$ oscillate in phase may be understood as follows. Consider the fundamental mode waveguides $W_2$ and $W_3$. If, as shown in FIG. 3, these waveguides oscillate in phase as indicated by fundamental lateral modes 320 and 322, the evanescent optical fields which couple into the waveguide $W_2'$ interfere constructively so that an in phase mode 326 will be excited in the waveguide $W_2'$. Such optical coupling provides a feedback path necessary to sustain laser oscillations in the waveguides $W_2, W_3$ and $W_2'$. On the other hand, consider what would happen if two adjacent waveguides were to oscillate out of phase. For example, if waveguides $W_3$ and $W_4$ were to oscillate out of phase as indicated by modes 322 and 323, the evanescent optical fields from the waveguides $W_3$ and $W_4$ which couple into the waveguide $W_3'$ would interfere destructively. Thus, a lossy mode is set up in the waveguide $W_3'$, and the out of phase oscillations in waveguides $W_3$ and $W_4$ would be difficult to achieve because of very high threshold currents. Looked at alternately, if the laser is oscillating and waveguide $W_3'$ has an oscillating field, then waveguides $W_3$ and $W_4$ are each excited by the same field in waveguide $W_3'$ and these components must be in phase. Only the in-phase operations allow each of the waveguide sections to oscillate and contribute to the overall gain.

In order to facilitate coupling between the fundamental mode waveguides $W_1 \ldots W_{10}$ and the fundamental mode waveguides $W_1' \ldots W_9'$, it is desirable that each waveguide have a relatively wide portion nearest a facet, a tapered portion, and a relatively narrow portion in the coupling region 310. Thus, for example, the wide portion of each of the waveguides has a width $X_0$ of about 3 microns. The narrow portion of each of the waveguides has a width $X_1$ of about 1.5 microns. The wide portion of each of the waveguides has a length $Y_1$ on the order of 50-100 microns, the tapered portion of each of the waveguides has a length $Y_2$ on the order of about 20 microns and the narrow portion has a length $Y_3$ of about 50-300 microns. Note that the tapering of the tapered portion of each waveguide is such that the phase velocity of radiation propagating therein remains substantially constant. The separation between adjacent waveguides is about 3 microns. Thus, s is about 6 microns.

Figure 3A:
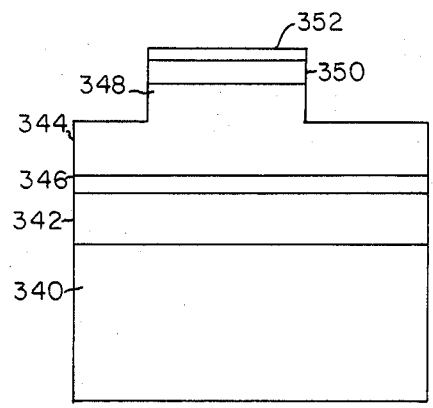
FIG. 3A is a sectional view along the line 3A—3A of a portion of the laser array shown in FIG. 3.

FIG. 3A shows a sectional view along the line 3A—3A of a portion of the array 300 shown in FIG. 3. A substrate 340 has cladding layer 342, 344 and an active layer 346 fabricated on it. A ridge 348 is formed in the cladding layer 344. A capping layer 350 is defined on the ridge 348 and a contact 352 is formed on the capping layer 350.

In array 300, the length $Y_3$ is the interaction or length for coupling between adjacent waveguides. In the array 300 of FIG. 3, this interaction length is uniform across the entire width of the array. However, as is discussed below, it may be desirable in certain circumstances for the interaction length to be different at different positions across the width of the array.

In an alternative embodiment of the invention, instead of using waveguides which include a relatively wide portion, a relatively narrow portion, and a tapered region in-between, it may be desirable for the waveguides to be somewhat tapered through the coupling region 310 as indicated by the dotted lines 330. The tapered region may illustratively be 50–300 microns long. Such a geometry may ease the transfer of energy between adjacent waveguides.

While the $L=1$ mode is the favored mode of oscillation for the waveguides $W_1' \ldots W_9'$, the waveguides $W_1' \ldots W_9'$ may simultaneously oscillate in the $L=1$ g, the $L=2$ and/or the $L=3$ mode. The effect of this is that the far field pattern produced by the laser waveguides $W_1' \ldots W_9'$ will not have a diffraction-limited beam width but, instead, will have a beam width two to three times that determined by the diffraction limit. This problem is solved in the laser array of FIGS. 4, 5 and 6, wherein mechanisms are provided to suppress oscillation of the higher order array modes. Such higher order array modes are suppressed by introducing losses where the $L=2$ array mode has its maxima.

Figure 4:
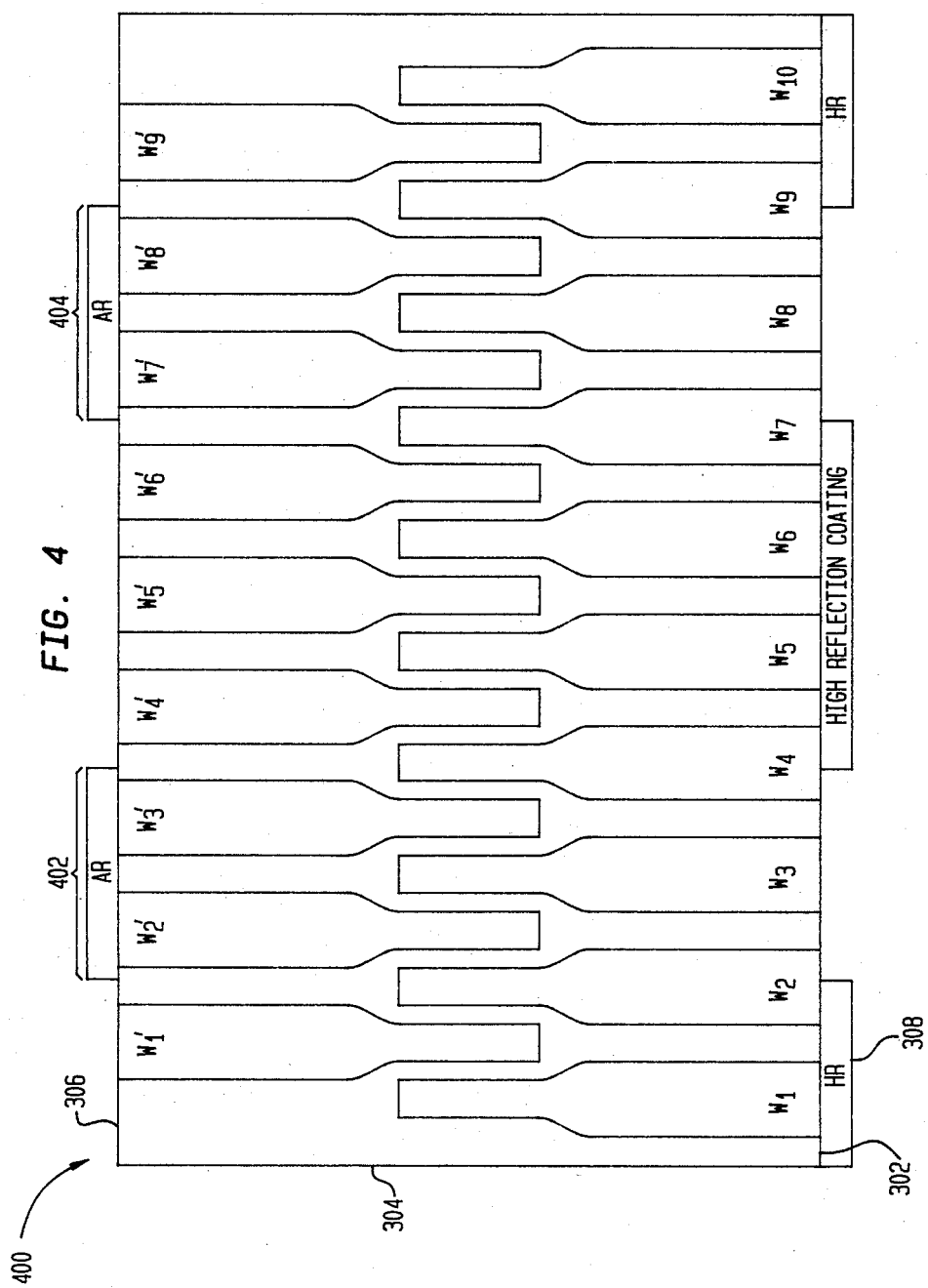
FIGS. 4, 5, and 6 show the array of FIG. 3, with the addition of mechanisms for suppressing higher order array modes.

The laser array 400 of FIG. 4 is identical to that of laser array 300 of FIG. 3, except that losses are selectively introduced for suppressing the $L=2$ mode. More particularly, in order to suppress the $L=2$ mode, anti-reflection coatings 402 and 404 are placed on the surface of the exit facet 306 near where the $L=2$ mode would have its peaks. Since the exit facet transmits more radiation where the anti-reflection coatings are located, the pumping current threshold for all the modes is increased but the pumping current threshold for the $L=2$ array mode is increased relatively more. Thus, only the $L=1$ array mode lases, and the far field pattern produced by the laser array 400 of FIG. 4 comprises a single lobe whose width is substantially equal to the diffraction-limited width. In addition, the high reflection coating 308 may be removed from the facet 302 near where the $L=2$ mode would have its peaks to increase losses for the $L=2$ mode.

Figure 5:
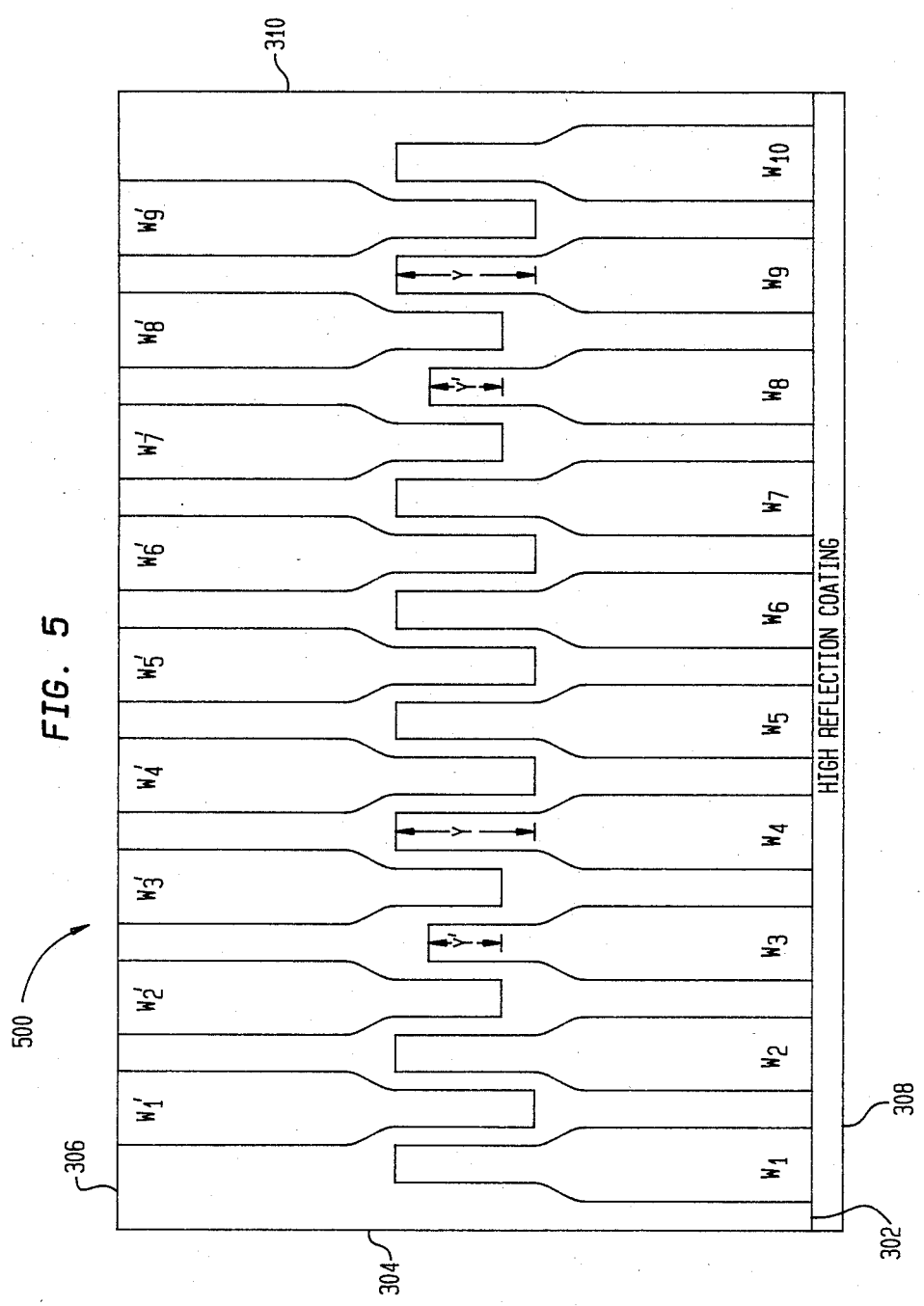

In FIG. 5, an alternative mechanism for suppressing the $L=2$ array mode is illustrated. In particular, the interaction length for coupling between adjacent waveguides is made shorter near where the $L=2$ mode has its peaks. This means that the adjacent waveguides couple less efficiently, thus significantly raising the threshold current required to sustain laser oscillations in the $L=2$ array mode. More particularly, near where one peak of the $L=2$ array mode would be located, the interaction length $Y'$ for coupling between the waveguide $W_8$ and the waveguides $W_{7'\ and\ W_8'}$ is on the order of 20–100 microns. Similarly, near where the other peak of the $L=2$ array mode would be located, the interaction length $Y'$ for coupling between the waveguide $W_3$ and the waveguides $W_2'$ and $W_3'$ is on the order of 20–100 microns. In contrast, the interaction length for coupling between other adjacent waveguides, such as, for example, the interaction length for coupling between the waveguides $W_5$ and $W_4'$ and $W_5$ and $W_5'$ is Y, where Y is about 50–300 microns. In the array 500 of FIG. 5, the interaction lengths are easily varied merely by varying the length of the narrow portions of the waveguides $W_1 \ldots W_{10}$ and $W_1' \ldots W_9'$.

Figure 6:
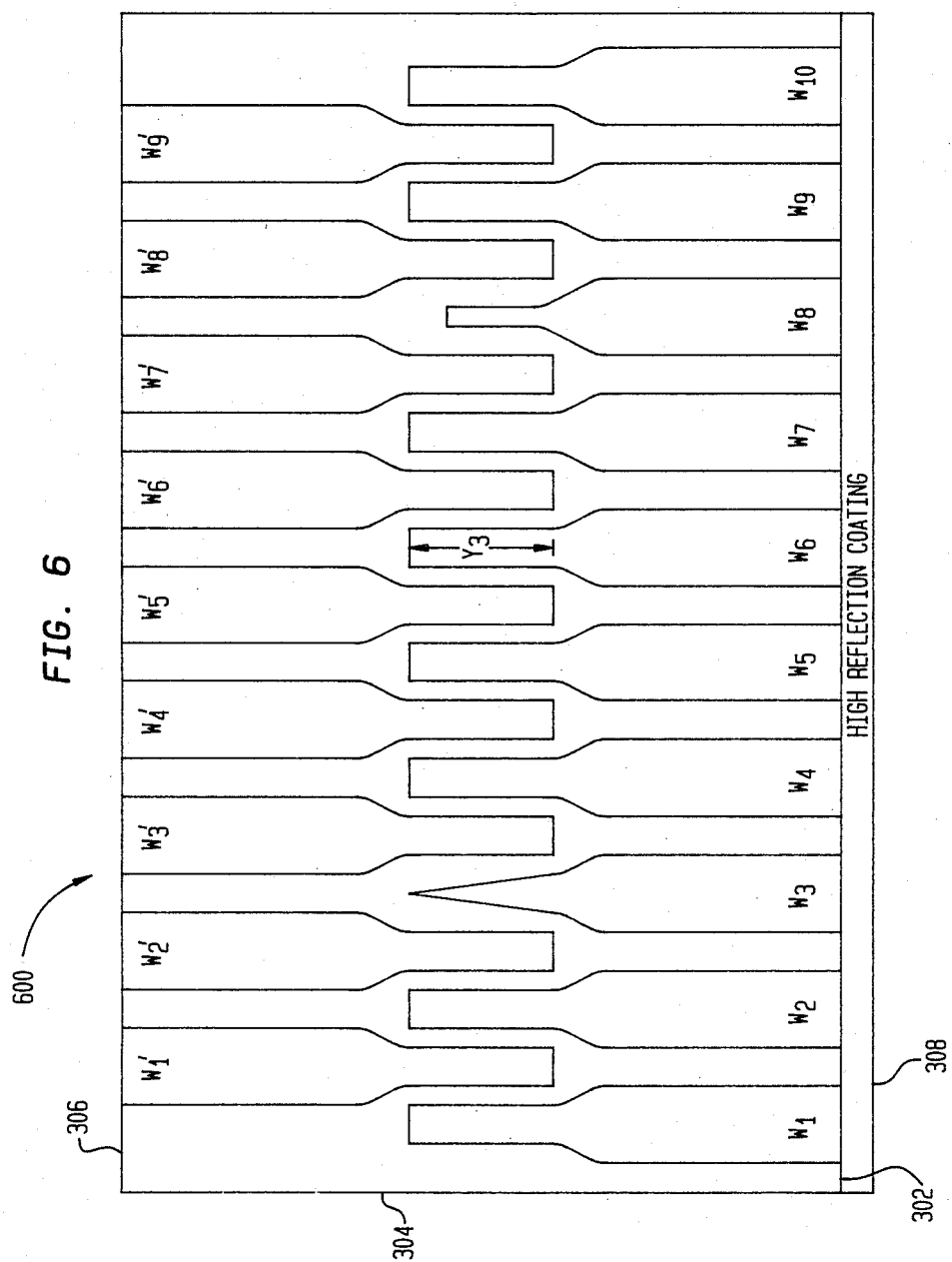

Alternatively, as shown in FIG. 6, coupling can be reduced near the maxima of the $L=2$ mode to increase the threshold current for the $L=2$ mode by sharply tapering one of the waveguides near where the $L=2$ mode has a maxima. An example of such a sharply tapered waveguide is waveguide $W_3$ of FIG. 6. The sharp tapering of waveguide $W_3$ significantly reduces the coupling between waveguide $W_3$ and waveguides $W_2'$ and $W_3'$. Still another way of reducing coupling near a maxima of the $L=2$ mode is exemplified by waveguide $W_8$ of FIG. 6. The narrow portion of waveguide $W_8$ in the coupling region 310 is on the order of about 0.5–1.0 microns wide so as to increase the spacing and decrease the coupling between waveguide $W_8$ and waveguides $W_7'$ and $W_8'$.

The techniques for suppressing the $L=2$ array mode illustrated in FIGS. 5 and 6 are especially advantageous. In comparison to the structure of FIG. 4, the structures of FIG. 5 and 6 are easier to fabricate. The reason for this is that technology for defining lateral waveguides of various geometries in a double heterostructure, as by forming specially shaped ridges in one of the cladding layers, is well known. In contrast, it may be difficult under certain circumstances to incorporate anti-reflection coatings or high-reflection coatings on particular portions of an end facet of a laser array.

Alternatively, the $L=2$ array mode may be suppressed in a structure such as that shown in FIG. 3 by not supplying pumping current to those waveguides near where the $L=2$ mode would have its peaks. For example, this may be done by using oxide layers to insulate particular waveguides from the metallic contact which supplies current to the waveguides comprising the array.

The maximum output power of the arrays shown in FIGs. 3–6 is equal to the maximum power output of each laser waveguide $W_1' \ldots W_9'$ multiplied by the number of waveguides in the set $W_1' \ldots W_9'$ (in this case 9). When the array is implemented in the AlGaAs material system, the power density in each waveguide $W_1' \ldots W_9'$ is limited to about 9 mW per square micrometer of emitting area. If the power density becomes higher, photochemical reactions occur at the partially reflecting crystal end facet 306, thereby causing the facet to gradually darken, apparently the effect of an amorphous oxide formed as a result of photochemical reactions. Over time the laser's performance degrades. In addition, laser light is absorbed because of non-radiative recombination of carriers at the end facet 306 where the semiconductor material ends. At high optical power densities (20 to 25 mW per square micrometer of emitting area), heavy light absorption induces a thermal runaway process causing the exit facet to melt, thereby catastrophically damaging the laser array. One way to increase the power output out of such laser arrays is to increase the width of the individual waveguides $W_1' \ldots W_9'$ so that each has a larger emitting area, thus reducing the emitted power per square micrometer. However, merely increasing the width of each individual waveguide $W_1' \ldots W_9'$ does not solve the problem because higher order lateral modes will then be supported in each of the individual waveguides. Such an array of multi-mode waveguides is unsuitable for applications where a single-lobe diffraction-limited beam is required even though higher output powers are achieved, as the higher order lateral modes in each waveguide $W_1' \ldots W_9'$ may cause the far field pattern to have multiple lobes.

Figure 7:
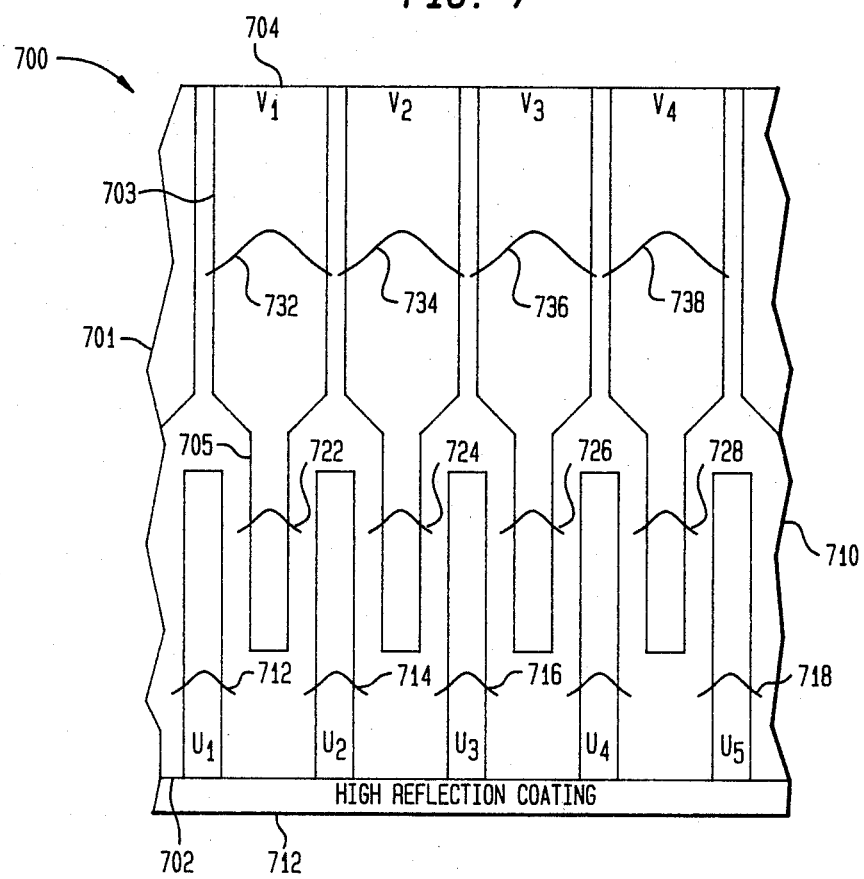
FIGS. 7 and 8 show alternative laser arrays comprising interdigitated sets of waveguides, in accordance with alternative embodiments of the present invention.

FIG. 7 schematically illustrates a semiconductor laser array 700 in which each of the laser waveguides near the emitting facet 704 has a relatively large emitting area while at the same time supporting only fundamental lateral mode oscillations Like the arrays of FIGS. 3, 4, 5, and 6, the array 700 of FIG. 7 comprises a semiconductor body 701 which has first and second spaced apart crystal end facets 702 and 704. Extending inward from the first end facet 702 is a first set of fundamental mode active waveguides $U_1$, $U_2$, $U_3$.... The waveguides $U_1$, $U_2$, $U_3$... terminate before the second end facet 704. Extending inward from the second end facet 704 is a second set of active waveguides $V_1$, $V_2$, $V_3$, $V_4$..... The waveguides $V_1$, $V_2$, $V_3$, $V_4$..... terminate before the first end facet 702. The facet 702 has a high-reflection coating 712 thereon so that facet 704 is the exit facet for radiation produced by the laser array 700. Like the laser array 300 of FIG. 3, the laser array 700 may be implemented as a double heterostructure in which two relatively wide bandgap cladding layers are separated by a narrow bandgap active layer. Ridges may be defined in the upper cladding layer to form the waveguides $U_1$, $U_2$, $U_3$ . . . and $V_1$, $V_2$, $V_3$, $V_4$.... Alternatively, ridges may be formed in the lower cladding layer (i.e. so-called inverted rib waveguides) or V-groove structures may be used to define the waveguides.

Each of the waveguides $V_1$, $V_2$, $V_3$, $V_4$... includes a wide lateral waveguide portion 703 and a contiguous narrow lateral waveguide portion 705. The wide waveguide portions 703 are normally wide enough to support at least the first order lateral mode, while the narrow waveguide portions 705 support only the fundamental lateral mode. It is the narrow portions 705 of the waveguides $V_1$, $V_2$, $V_3$, $V_4$... which are interdigitated with the fundamental mode waveguides $U_1$, $U_2$, $U_3$, $U_4$... in the coupling region 710. Alternately, they can be tapered as shown with dashed lines in FIG. 3. In the coupling region 710, optical coupling takes place between the narrow portions 705 of the waveguides $V_1$, $V_2$, $V_3$, $V_4$... and the waveguides $U_1$, $U_2$, $U_3$... Without such coupling, there will be no feedback for supporting laser oscillations, as none of the waveguides $U_1$, $U_2$, $U_3$, $U_4$... and $V_1$, $V_2$, $V_3$, $V_4$... extend between both crystal end facets. For the reasons discussed above, the coupling between the waveguides $U_1$, $U_2$, $U_3$, $U_4$ . . . and the narrow portions 705 of the waveguides $V_1$, $V_2$, $V_3$, $V_4$... is optimal and the threshold current lowest when the waveguides $U_1$, $U_2$, $U_3$, $U_4$... and the narrow fundamental mode portions 705 of the waveguides $V_1$, $V_2$, $V_3$, $V_4$... oscillate in phase. Such in phase oscillation is indicated by the fundamental modes 712, 714, 716, 718 and 722, 724, 726, 728 of FIG. 7. Note, the portions of the waveguides $V_1$, $V_2$, $V_3$, $V_4$... and the waveguides $U_1$, $U_2$, $U_3$, $U_4$... that are interdigitated in the coupling region may be tapered as shown by the dotted lines 330 in FIG. 3.

The coupling between the narrow fundamental mode portions 705 of the waveguides $V_1$, $V_2$, $V_3$, $V_4$... and the wide portions 703 of these waveguides is such that, the coupling losses are greatest for the higher order lateral modes. Thus the optical fields in the wide waveguide portions 703 include only fundamental lateral mode oscillations. This is indicated by modes 732, 734, 736, 738 in FIG. 7. A detailed discussion of the coupling between contiguous narrow and wide laser waveguide portions such as the waveguide portions 703, 705 can be found in U.S. patent application Ser. No. 809,578 entitled "High Power Semiconductor Lasers", filed-on behalf of E. I. Gordon on Dec. 16,1983 and assigned to the assignee hereof. The aforementioned patent application is incorporated herein by reference. The coupling between the wide and narrow portions 703, 705 of the waveguides $V_1$, $V_2$, $V_3$, $V_4$ . . . may be gradual (i.e. tapered) as shown in FIG. 7 or may be abrupt, as shown in the aforementioned U.S. patent application. Illustratively, each of the wide portions 703 of the waveguides $V_1$, $V_2$, $V_3$, $V_4$... has a width of about 6 microns while each of the narrow portions 705 has a width of about 3 microns. Each of the wide portions 703 has a length of about 50-100 microns and each of the narrow portions 705 has a length of about 50-300 microns. The fundamental mode waveguides $U_1$, $U_2$, $U_3$, $U_4$ are about 300-400 microns long and about 3 microns wide. The waveguides $U_1$, $U_2$, $U_3$, $U_4$ have an interwaveguide spacing of about 12 microns. Thus, the laser array 700 of FIG. 7 is a very high power laser array which operates in the zero degree phase shift mode to produce a single lobe beam in the far field. Each of the waveguides $V_1$, $V_2$, $V_3$, $V_4$... can emit a much higher output power without facet damage than could a conventional fundamental mode waveguide in the same position.

Figure 8:
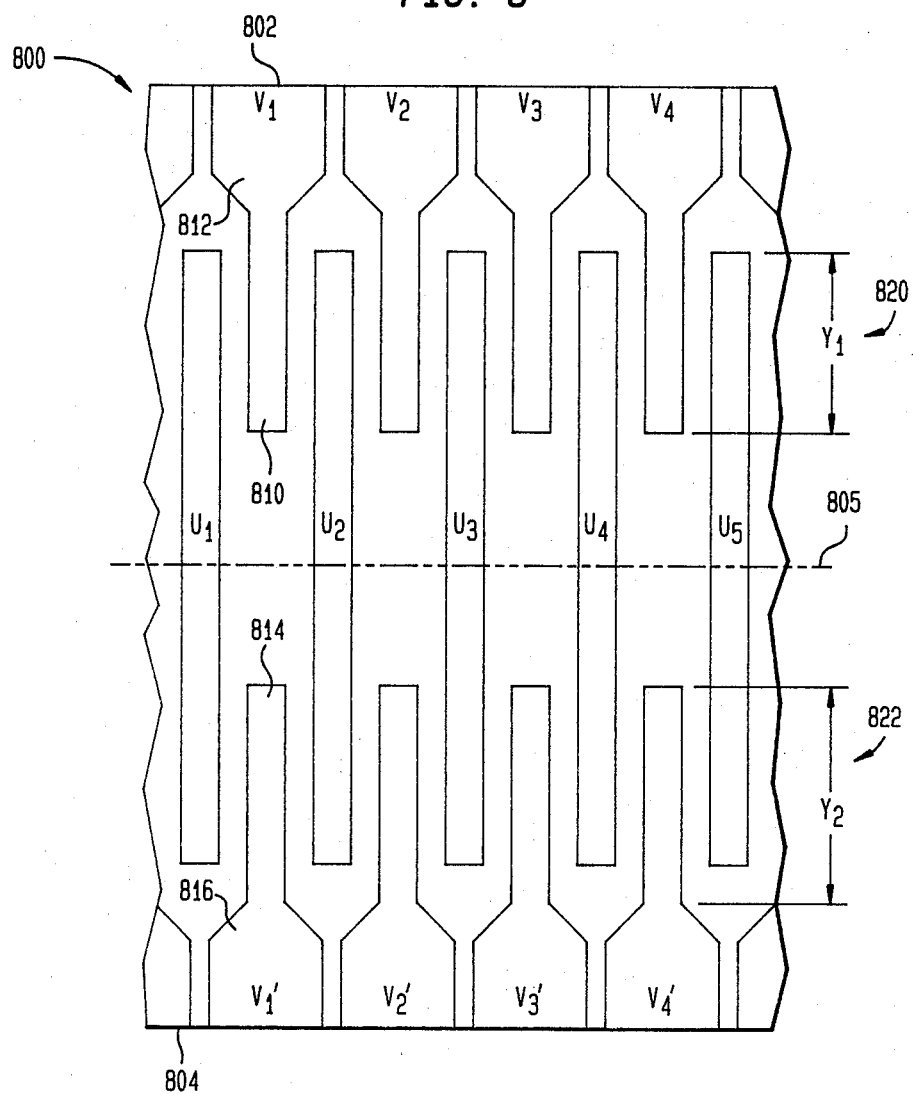

An alternative laser array utilizing the principles of the present invention may be formed by considering the high reflecting facet 702 of FIG. 7 as a mirror plane and forming an identical structure on the other side thereof. Such a laser array 800 is illustrated in FIG. 8. The laser array 800 has two emitting facets 802 and 804 and is symmetrical about the mirror plane 805.

The laser array 800 comprises three sets of waveguides. These are $V_1$, $V_2$, $V_3$, $V_4$, . . . , $U_1$, $U_2$, $U_3$, $U_4$, $U_5$ . . . , and $V_1'$, $V_2'$, $V_3'$, $V_4'$ . . . Each of the waveguides $V_1$, $V_2$, $V_3$, $V_4$, . . . includes a narrow fundamental mode portion 810 and a wide portion 812 normally wide enough to support at least the first high-order lateral mode. Similarly, each of the waveguides $V_1'$, $V_2'$, $V_3'$, $V_4'$ . . . includes a narrow fundamental mode portion 814 and a portion 816 normally wide enough to support at least the first high-order lateral mode. The waveguides $U_1$, $U_2$, $U_3$, $U_4$, $U_5$ . . . are fundamental lateral-mode waveguides.

The narrow portions 810 of the waveguides $V_1$, $V_2$, $V_3$, $V_4$, . . . are interdigitated between and coupled to the waveguides $U_1$, $U_2$, $U_3$, $U_4$, $U_5$... in a first coupling region 820 of length $Y_1$. The narrow portions 814 of the waveguides $V_1'$, $V_2'$, $V_3'$, $V_4'$, . . . are interdigitated between the waveguides $U_1$, $U_2$, $U_3$, $U_4$, $U_5$ . . . in a second coupling region 822 of length $Y_2$.

Thus, the waveguides $U_1$, $U_2$, $U_3$, $U_4$, $U_5$... serve to couple the waveguides $V_1$, $V_2$, $V_3$, $V_4$, . . . and the waveguides $V_1'$, $V_2'$, $V_3'$, $V_4'$, . . . so as to define feedback paths for the laser 800 of FIG. 8. For the reasons discussed above, the threshold current for lasing is lowest when the narrow portions of the waveguides $V_1$, $V_2$, $V_3$, $V_4$, . . . , the fundamental mode waveguides $U_1$, $U_2$, $U_3$, $U_4$, $U_5$ . . . and the narrow portions of the waveguides $V_1'$, $V_2'$, $V_3'$, $V_4'$, . . . all oscillate in phase.

The narrow and wide portions 810, 812 and 814, 816 of the waveguides $V_1$, $V_2$, $V_3$, $V_4$, $V_5$... and $V_1'$, $V_2'$, $V_3'$, $V_4'$, $V_5'$... are coupled so that only the fundamental lateral mode is supported in the wide region. Thus, when viewing facet 802 or 804, one sees an array of wide fundamental mode lasers which oscillate in the zero degree phase shift mode to produce a high power single lobe diffraction limited beam in the far field.

The concepts and structures incorporated into the laser arrays of the present invention may also be utilized to form a very wide stripe double heterostructure or LOC laser which oscillates in the fundamental lateral mode. A very wide stripe double heterostructure laser which oscillates in the fundamental lateral mode is desirable because its far field pattern has a single lobe, while at the same time, output power limitations due to gradual or catastrophic failure of the emitting facet are relaxed because of the very large emitting area.

Figure 9:
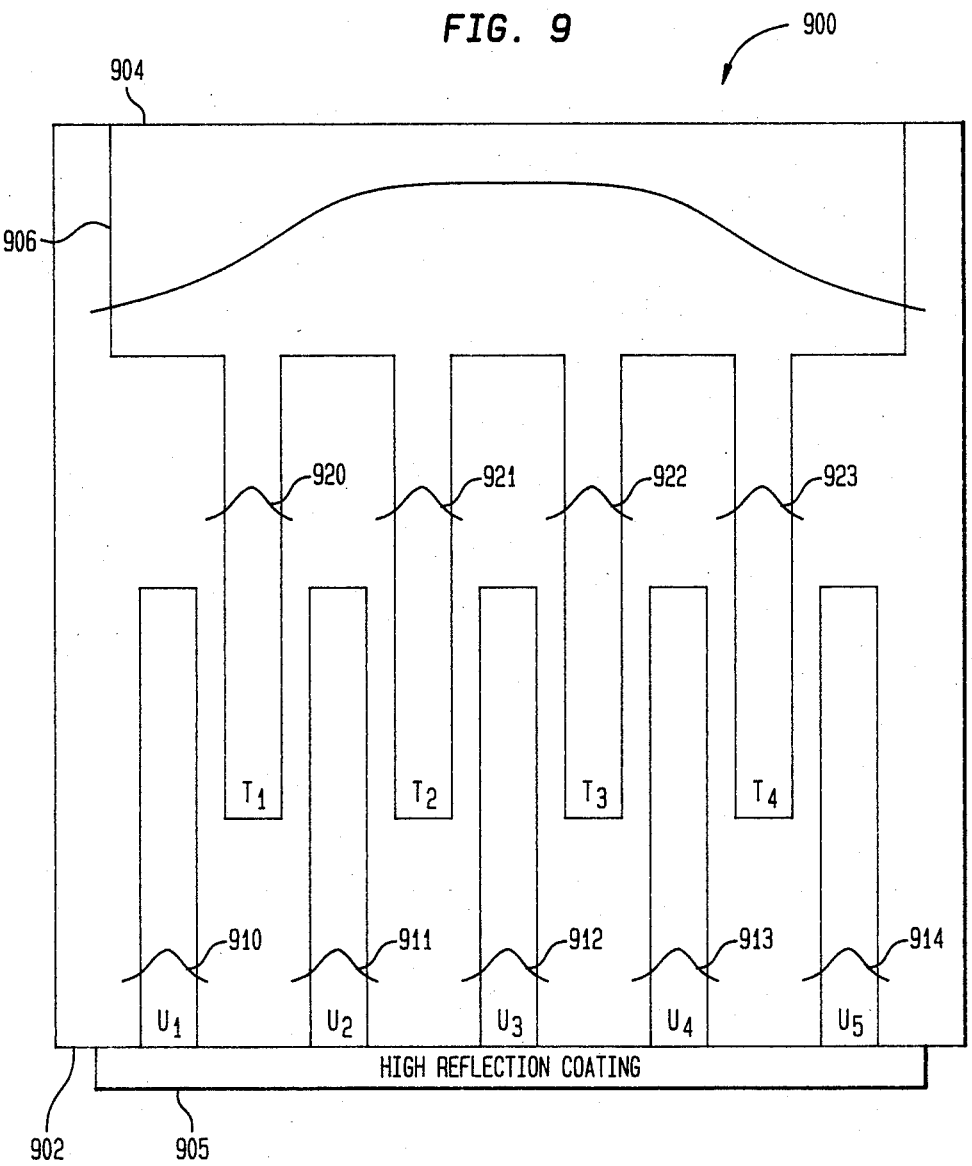
FIG. 9 shows a very wide stripe double heterostructure laser which oscillates in the fundamental lateral mode through the use of interdigitated waveguide sets in accordance with an illustrative embodiment of the invention.

Such a very wide stripe double heterostructure laser is schematically illustrated in FIG. 9. Illustratively, laser 900 comprises a semiconductor body having first and second partially reflecting end facets 902, 904. The end facet 902 has a high-reflection coating 905 thereon so that the end facet 904 is the emitting facet. Preferably, the laser 900 is a double heterostructure comprising first and second relatively wide bandgap cladding layers (not shown) of opposite conductivity type, which cladding layers are separated by a narrow bandgap active layer (not shown). Illustratively, the active layer is GaAs, while the wide bandgap cladding layers are $Al_xGa_{1-x}As$ where x is in the range of 0.25 to 0.45. The cladding layers and active layer are deposited on a GaAs substrate. The waveguide structures of the laser 900 of FIG. 9 may be formed by ridges in the upper cladding layer or by other techniques for defining lateral waveguides in a double heterostructure.

Extending inward from the facet 902 is a first set of waveguides $U_1, U_2, U_3, U_4, U_5$. Each of these waveguides is a fundamental mode waveguide which, illustratively, has a width of about 3 microns. Interdigitated between the waveguides $U_1, U_2, U_3, U_4, U_5$ is a second set of waveguides $T_1, T_2, T_3, T_4$. These waveguides are also fundamental mode waveguides having a width of about 3 microns. The waveguides $T_1, T_2, T_3, T_4$ are formed contiguously with and are optically coupled to an extremely wide laterally guided region 906, which region 906 extends up to the end facet 904. The region 906 may be up to 40 or 50 microns wide. The waveguides $T_1, T_2, T_3, T_4$ best couple to the fundamental lateral mode of the wide region 906, since they are all in phase and so are the various portions of a fundamental lateral spatial mode. Thus, the laser 900 is a high power wide stripe double heterostructure laser which operates in the fundamental lateral mode and which has an emitting area as wide as 40 or 50 microns. Such a width of 40 or 50 microns normally supports a multiplicity of higher order lateral modes. However, for the reasons discussed below, higher order lateral modes are not excited in the region 906.

In order to define feedback paths necessary to sustain laser oscillations in the laser 900 of FIG. 9, the single mode waveguides $U_1, U_2, U_3, U_4, U_5$ must be coupled to waveguides $T_1, T_2, T_3, T_4$, which waveguides are in turn coupled to the very wide guided structure 906. As previously indicated, such coupling is optimum and the threshold current for lasing lowest, when the waveguides $U_1, U_2, U_3, U_4, U_5$ and the waveguides $T_1, T_2, T_3, T_4$, all oscillate in the same phase. Thus, illustratively, the waveguides $U_1, U_2, U_3, U_4$ oscillate with the modes 910, 911, 912, 913 and 914 as shown in FIG. 9 and the waveguides $T_1, T_2, T_3, T_4$, oscillate with the modes 920, 921, 922 and 923 as shown in FIG. 9. The coupling between the fundamental mode waveguides $T_1, T_2, T_3, T_4$, and the very wide guided structure 906 is such that coupling losses are greatest for higher order lateral modes and, thus, only oscillations in the fundamental lateral mode are sustained in the very wide structure 906. Looked at alternatively, the feedback path from the very wide guided structure 906 is effective only when the field distribution corresponds to the lowest order mode. Accordingly, a very wide stripe double heterostructure laser which oscillates in the fundamental lateral mode is achieved.

Finally, the above described embodiments of the invention are intended to be illustrative only. Numerous alternative embodiments may be devised by those skilled in the art without departing from the spirit and scope of the following claims. For example, instead of starting from an n-type GaAs substrate, the devices of the present invention may be formed starting with a p-type GaAs substrate. In addition, instead of using the AlGaAs materials system to form the structures of the present invention, the InGaAsP materials system may be used.

We claim:

1. A semicodnuctor laser diode array comprising:
   a substrate,
   a plurality of layers fabricated on said substrate, said layers including an active layer capable of emitting radiation when a pumping current is applied thereto, said active layer terminating in first and second end facets,
   contact means for applying said pumping current,
   a first set of parallel spaced apart active waveguides defined in said active layer, said first set of active waveguides extending from said first end facet and terminating before said second end facet,
   a second set of parallel spaced apart active waveguides defined in said active layer, said second set of active waveguides extending from said second end facet and termianting before said first end facet,
   said first and second sets of active waveguides being interdigitated with one another in a coupling region wherein there is optical coupling between adjacent active waveguides in the first and second sets, said coupling providing feedback paths for supporting laser oscillations in said first and second sets of active waveguides, the threshold current for lasing being lowest when all of said active waveguides in said first and second sets oscillate in phase.

2. A semiconductor laser diode array which favors oscillation in the zero degree phase shift mode comprising:
   a substrate,
   a plurality of layers fabricated on said substrate, said layers including an active layer capable of emitting radiation when a pumping current is applied thereto, said active layer terminating at first and second spaced apart end facets,
   contact means for receiving said pumping current,
   a first set of parallel spaced apart active waveguides defined in said active layer extending inward from the first facet and terminating before the second facet,
   a second set of parallel spaced apart active waveguides defined in said active layer extending inward from the second facet and terminating before said first facet, said first and second sets of active waveguides being interdigitated with one another in a coupling region wherein there is optical coupling between adjacent active waveguides in said first and second sets so as to define feedback paths which extend from said first end facet along said active waveguide in said first set, through said coupling region, and along an active waveguide in said second set to said second end facet, whereby said active waveguides in said first and second sets favor oscillation in the zero degree phase shift mode.

3. The array of claim 2 wherein each of said active waveguides in said first and second sets is an index-guided fundamental lateral mode waveguide.

4. The array of claim 2 wherein each of said active waveguides is a fundamental lateral waveguide including a first portion located near one of said end facets, and a second portion in said coupling region, said first portion being wider than said second portion, said first and second portions being connected to each other by a tapered portion.

5. The array of claim 2 wherein each of said active waveguides is a fundamental lateral mode waveguide including a portion of uniform width near one of said end facets, and a tapered portion in said coupling region.

6. The array of claim 5 wherein said array includes a means for introducing loss for suppressing higher order array lateral modes greater than the fundamental lateral mode.

7. The array of claim 6 wherein said loss means comprises anti-reflection coated regions formed on one of said end facets.

8. The array of claim 5 wherein a higher order array lateral mode greater than the fundamental lateral mode is suppressed by decreasing the coupling efficiency between active waveguides in said first and second sets near where the higher order array lateral mode has maxima.

9. The array of claim 5 wherein the interaction length for coupling between active waveguides of said first and second sets in said coupling region is shortened at predetermined locations in said array to suppress one or more higher order array lateral modes greater than the fundamental lateral mode.

10. The array of claim 5 wherein a higher order array lateral mode greater than the fundamental lateral mode is suppressed by sharply tapering at least one active waveguide near where the higher order array lateral mode has maxima.

11. The array of claim 6 wherein a higher order array lateral mode greater than the fundamental lateral mode is suppressed by increasing the spacing between adjacent active waveguides in the coupling region near where the higher order array lateral mode has maxima.

12. The array of claim 2 wherein at least one of said first and second sets includes an active waveguide which comprises:

a first waveguide portion located adjacent one of said end facet, said first waveguide portion being wide enough to support at least the fundamental lateral mode, and a second waveguide portion formed contiguous with said first waveguide portion and extending into said coupling region for optical coupling with the active waveguide of the other set, said second waveguide portion supporting only the fundamental lateral mode, said waveguide portions being coupled such that the coupling loss is least for the fundamental lateral mode so that said first waveguide portion and said second waveguide portion both support only the fundamental lateral mode.

13. The array of claim 1 wherein said first set of waveguides are fundamental lateral mode waveguide and wherein said second set of waveguides are fundamental lateral mode waveguides, said second set of waveguides all terminating in a laterally guided region, wide enough to support higher order lateral mode, said fundamental mode waveguides of said second set being coupled to said laterally guided region such that coupling losses are least for the fundamental lateral mode of the laterally guided region so that the laterally guided region supports only the fundamental lateral mode.

14. A semiconductor laser diode array comprising:
a substrate,
a plurality of layers fabricated on said substrate, said layers including an active layer capable of emitting radiation when a pumping current is applied thereto, said active layer terminating at first and second spaced apart end facets,
contact means for applying said pumping current,
first and second parallel spaced apart active waveguides defined in said active layer extending inward from said first end facet and terminating before said second end facet, and
a third active waveguide defined in said active layer extending inward from said second end facet and terminating in the space between said first and second active waveguide before said first end facet,
said first and second active waveguides being optically coupled to said third active waveguide to provide a feedback path for sustaining laser oscillations in said first, second, and third active waveguides, the threshold current for sustaining laser oscillations being lowest when said first, second and third active waveguides oscillate in phase.

15. A semiconductor laser diode comprising;
a substrate,
a plurality of layers fabricated on said substrate, said layers including an active layer capable of emitting radiation when a pumping current is applied thereto, said active layer terminating at first and second spaced apart end facets,
contact means for applying said pumping current,
a first set of parallel spaced apart active waveguides defined in said active layer extending inward from said first end facet and terminating before said second end facet,
a second set of parallel spaced apart active waveguides defined in said active layer extending inward from said second end facet and termianting before said first end facet, and
a third set of parallel spaced apart active waveguides defined in said active layer in the space between said end facets but spaced apart from both said end facets,
said first and third active waveguide sets being intedigitated with one another in a first coupling region where there is optical coupling between adjacent active waveguides in the first and third sets, and said second and third active waveguide sets being interdigitated with one another in a second coupling region where there is optical coupling between adjacent active waveguides in the second and third sets, the threshold current for lasing being lowest when all of said active waveguides in said first, second, and third sets oscillate in phase.

* * * * *